(12) United States Patent
Kim et al.

(10) Patent No.: US 12,347,346 B2
(45) Date of Patent: Jul. 1, 2025

(54) STRETCHABLE DISPLAY DEVICE

(71) Applicant: LG Display Co., Ltd., Seoul (KR)

(72) Inventors: KiHan Kim, Paju-si (KR); Hyokang Lee, Seoul (KR); MyungSub Lim, Seoul (KR); Sujin Ham, Seoul (KR); Hyowon Kwon, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 334 days.

(21) Appl. No.: 17/119,496

(22) Filed: Dec. 11, 2020

(65) Prior Publication Data

US 2021/0192988 A1 Jun. 24, 2021

(30) Foreign Application Priority Data

Dec. 24, 2019 (KR) .................. 10-2019-0174144
Sep. 28, 2020 (KR) .................. 10-2020-0125862

(51) Int. Cl.
*G09F 9/30* (2006.01)
*G06F 1/16* (2006.01)
(Continued)

(52) U.S. Cl.
CPC ............ *G09F 9/301* (2013.01); *G06F 1/1652* (2013.01); *G06F 1/26* (2013.01); *H01L 23/5386* (2013.01); *H01L 23/5387* (2013.01); *H01L 25/167* (2013.01); *H10D 86/411* (2025.01); *H10D 86/60* (2025.01)

(58) Field of Classification Search
CPC ... G09F 9/301; G06F 1/1652; H01L 23/5386; H01L 23/5387; H01L 25/167; H01L 27/1218; H01L 23/145
See application file for complete search history.

(56) References Cited

U.S. PATENT DOCUMENTS 9,844,133 B2 * 12/2017 Tomita .................. H05K 3/202
2012/0051005 A1 3/2012 Vanfleteren et al.
(Continued)

FOREIGN PATENT DOCUMENTS

CN 102196657 A 9/2011
CN 107731866 A 2/2018
(Continued)

OTHER PUBLICATIONS

Lee et al., Catheter-Based Systems with Integrated Stretchable Sensor and Conductors in Cardiac Electrophysiology, Proceedings of the IEEE, vol. 103, No. 4, 684 (Year: 2015).*

*Primary Examiner* — Jay C Kim
*Assistant Examiner* — Woo K Lee
(74) *Attorney, Agent, or Firm* — Seed IP Law Group LLP

(57) ABSTRACT

The present disclosure provides a stretchable display device. The stretchable display device including a plurality of first substrates which is disposed on a lower substrate to be spaced apart from each other and includes at least one pixel. The display device includes a plurality of connection substrates which connects adjacent first substrates among the plurality of first substrates. The display device includes a plurality of connection lines which electrically connects pads disposed on the plurality of adjacent first substrates and is disposed on side surfaces of the plurality of connection substrates. Therefore, a resistance of the connection line may be reduced or minimized.

12 Claims, 18 Drawing Sheets

(51) Int. Cl.
*G06F 1/26* (2006.01)
*H01L 23/538* (2006.01)
*H01L 25/16* (2023.01)
*H10D 86/40* (2025.01)
*H10D 86/60* (2025.01)

(56) References Cited

U.S. PATENT DOCUMENTS

| | | | |
|---|---|---|---|
| 2012/0062447 A1* | 3/2012 | Tseng | H10K 59/131 345/33 |
| 2014/0299362 A1 | 10/2014 | Park et al. | |
| 2014/0299363 A1 | 10/2014 | Su et al. | |
| 2016/0181346 A1 | 6/2016 | Kwon et al. | |
| 2017/0169918 A1 | 6/2017 | Park et al. | |
| 2017/0365557 A1 | 12/2017 | Rogers et al. | |
| 2018/0046221 A1 | 2/2018 | Choi et al. | |
| 2020/0051964 A1* | 2/2020 | Jung | H01L 25/162 |
| 2020/0281074 A1 | 9/2020 | Okimoto et al. | |

FOREIGN PATENT DOCUMENTS

| | | |
|---|---|---|
| CN | 108183126 A | 6/2018 |
| CN | 108933148 A | 12/2018 |
| CN | 109742119 A | 5/2019 |
| CN | 109830504 A | 5/2019 |
| JP | 6567795 B1 | 8/2019 |
| KR | 10-2016-0093125 A | 8/2016 |
| KR | 10-2020-0059141 A | 5/2020 |
| TW | 201937995 A | 9/2019 |

* cited by examiner

STRETCHABLE DISPLAY DEVICE

CROSS-REFERENCE TO RELATED APPLICATIONS

This application claims the priority of Korean Patent Application No. 10-2019-0174144 filed on Dec. 24, 2019 and Korean Patent Application No. 10-2020-0125862 filed on Sep. 28, 2020, in the Korean Intellectual Property Office, the disclosure of which are incorporated herein by reference.

BACKGROUND

Technical Field

The present disclosure relates to a stretchable display device, and more particularly, to a stretchable display device including a connection line.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provides a stretchable display device which is capable of reducing or minimizing a line resistance.

One or more embodiments of the present disclosure provides a stretchable display device which is capable of ensuring a sufficient extension rate.

The technical benefits of the present disclosure are not limited to the above-mentioned benefits, and other benefits, which are not mentioned above, can be clearly understood by those skilled in the art from the following descriptions.

According to an aspect of the present disclosure, a stretchable display device includes a plurality of first substrates which is disposed on a lower substrate to be spaced apart from each other and includes at least one pixel; a plurality of connection substrates which connects adjacent first substrates among the plurality of first substrates; and a plurality of connection lines which electrically connects pads disposed on the plurality of adjacent first substrates and is disposed on side surfaces of the plurality of connection substrates. Therefore, a resistance of the connection line may be reduced or minimized.

Other detailed matters of the embodiments are included in the detailed description and the drawings.

According to the present disclosure, a connection line is formed on a side surface of the connection substrate to sharply reduce a resistance of the connection line.

According to the present disclosure, a width of a connection line in a curved area is reduced or minimized to improve an extension rate.

The effects according to the present disclosure are not limited to the contents above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
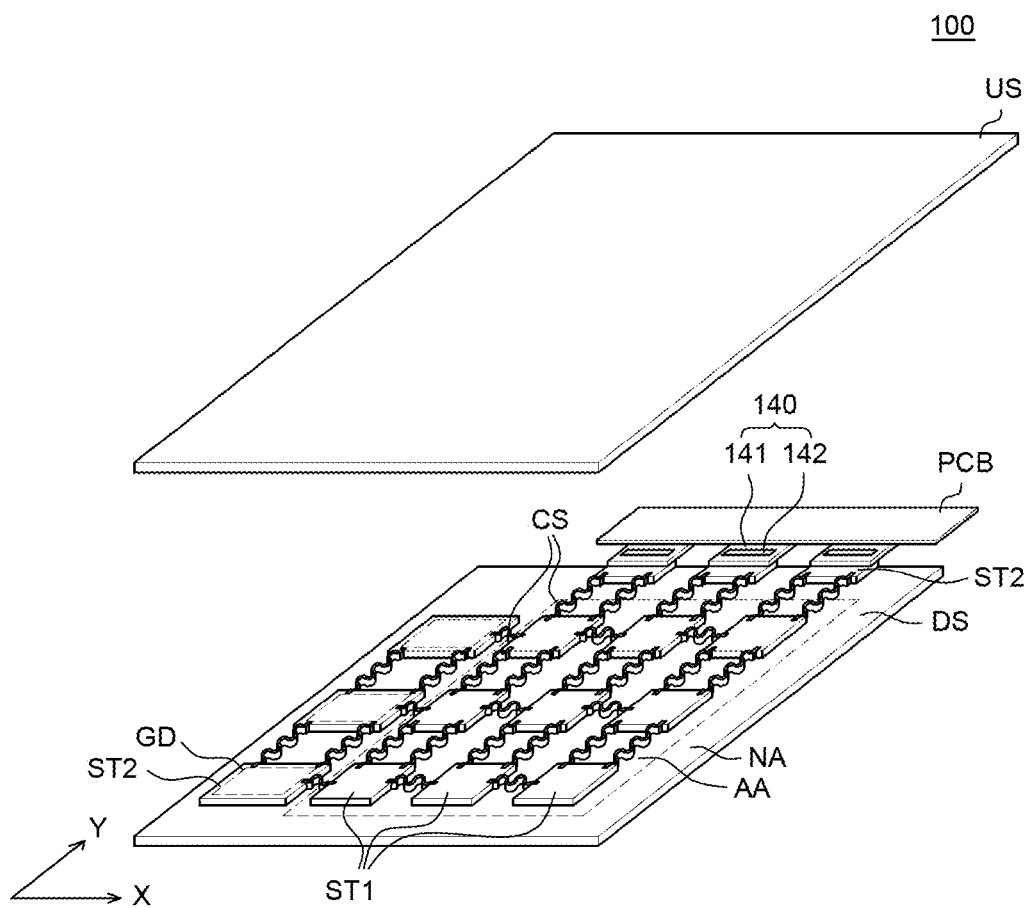
FIG. 1 is an exploded perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.

Stretchable Display Device

A stretchable display device may be referred to as a display device which is capable of displaying images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall. Further, when a force applied by the user is removed, the stretchable display device may return to its original shape.

FIG. 1 is an exploded perspective view of a stretchable display device according to an embodiment of the present disclosure.

Referring to FIG. 1, a stretchable display device 100 includes a lower substrate DS, a plurality of first substrates ST1, a plurality of second substrates ST2, a plurality of connection substrates CS, a chip on film (COF) 140, a printed circuit board PCB, and an upper substrate US.

The lower substrate DS is a substrate which supports and protects several components of the stretchable display device 100. The lower substrate DS which is a soft substrate or a flexible substrate may be configured by an insulating material which is bendable or extendable. For example, the lower substrate DS may be formed of a silicon rubber such as polydimethylsiloxane (PDMS) or an elastomer such as polyurethane (PU) or polytetrafluoroethylene (PTFE) and thus have a flexible property. However, the material of the lower substrate DS is not limited thereto.

The lower substrate DS is a flexible substrate so as to be reversibly expanded and contracted. Further, an elastic modulus of the lower substrate DS may be several MPa to several hundreds of MPa, for example, may be 0.5 MPa to 1 MPa. Further, an extension rupture rate of the lower substrate DS may be 100% or higher. Here, the extension rupture rate refers to an extension rate at a timing when an object to be extended is broken or cracked. A thickness of the lower substrate DS may be 10 μm to 1 mm but is not limited thereto.

The lower substrate DS may have a display area AA and a non-display area NA enclosing the display area AA.

The display area AA is an area in which an image is displayed in the stretchable display device 100 and a display element and various driving elements for driving the display element are disposed in the display area AA. The display area AA may include a plurality of pixels including a plurality of sub-pixels. The plurality of pixels is disposed in the display area AA and includes a plurality of display elements. The plurality of sub-pixels may be connected to various wiring lines, respectively. For example, the plurality of sub-pixels may be connected to various wiring lines such as a gate line, a data line, an emission signal line, a high potential power line, a low potential power line, a reference voltage line, or a compensation signal line.

The non-display area NA is an area adjacent to the display area AA. The non-display area NA is adjacent to the display area AA to enclose the display area AA. In the non-display area NA, no image is displayed and wiring lines and circuit units may be formed. For example, in the non-display area NA, a plurality of pads is disposed, and the pads may be connected to the plurality of sub-pixels of the display areas AA, respectively.

The plurality of first substrates ST1 and the plurality of second substrates ST2 are disposed on the lower substrate DS. The plurality of first substrates ST1 may be disposed in the display area AA of the lower substrate DS and the plurality of second substrates ST2 may be disposed in the non-display area NA of the lower substrate DS. Even though in FIG. 1, the plurality of second substrates ST2 is disposed at an upper side and a left side of the display area AA in the non-display area NA, it is not limited thereto and may be disposed in an arbitrary area of the non-display area NA.

The plurality of first substrates ST1 and the plurality of second substrates ST2 are rigid substrates and are spaced apart from each other to be independently disposed on the lower substrate DS. The plurality of first substrates ST1 and the plurality of second substrates ST2 may be rigider than the lower substrate DS. That is, the lower substrate DS may have a flexible characteristic more than the plurality of first substrates ST1 and the plurality of second substrates ST2 and the plurality of first substrates ST1 and the plurality of second substrates ST2 have a rigid characteristic more than the lower substrate DS.

The plurality of first substrates ST1 and the plurality of second substrates ST2 which are rigid substrates may be formed of a plastic material having flexibility and for example, may be formed of polyimide (PI), polyacrylate, or polyacetate, but is not limited thereto. In this case, the plurality of first substrates ST1 and the plurality of second substrates ST2 may be formed of the same material but are not limited thereto and may be formed of different materials.

Moduli of the plurality of first substrates ST1 and the plurality of second substrates ST2 may be higher than that of the lower substrate DS. The modulus is an elastic modulus which represents a ratio being deformed by a stress with respect to a stress applied to the substrate. The higher the modulus, the higher a degree of hardness. Therefore, the plurality of first substrates ST1 and the plurality of second substrates ST2 may be a plurality of rigid substrates having rigidity as compared with the lower substrate DS. The moduli of the plurality of first substrates ST1 and the plurality of second substrates ST2 may be 1000 times or higher than the modulus of the lower substrate DS but are not limited thereto. For example, elastic moduli of the plurality of first substrates ST1 and the plurality of second substrates ST2 may be 2 GPa to 9 GPa depending on a transparency. More specifically, when the plurality of first substrates ST1 and the plurality of second substrates ST2 are transparent, the elastic modulus is 2 GPa and when the plurality of first substrates ST1 and the plurality of second substrates ST2 are opaque, the elastic modulus is 9 GPa.

The COF 140 is a film on which various components are disposed on a base film 141 having a flexibility and supplies signals to the plurality of sub-pixels of the display area AA. The COF 140 may be bonded to the plurality of pads of the plurality of second substrates ST2 disposed in the non-display area NA and supplies a power voltage, a data voltage, a gate voltage, or the like to each of the plurality of sub-pixels of the display area AA through the pads. The COF 140 includes the base film 141 and a driving IC 142. Further, various components may be additionally disposed thereon.

The base film 141 is a layer which supports the driving IC 142 of the COF 140. The base film 141 may be formed of an insulating material, and for example, may be formed of an insulating material having a flexibility.

The driving IC 142 is a component which processes data for displaying images and a driving signal for processing the images. In FIG. 1, even though it is illustrated that the driving IC 142 is mounted by the COF 140 technique, it is not limited thereto and the driving IC 142 may be mounted by chip on glass (COG), tape carrier package (TCP), or the like.

In FIG. 1, one second substrate ST2 is disposed in the non-display area NA at the upper side of the display area AA so as to correspond to one row of first substrates ST1 disposed in the display area AA and one COF 140 is disposed for one second substrate ST2 but is not limited thereto. That is, one second substrate ST2 and one COF 140 may be disposed so as to correspond to the first substrates ST1 in a plurality of rows.

A control unit such as an IC chip or a circuit unit may be mounted on the printed circuit board PCB. Further, on the printed circuit board PCB, a memory or a processor may also be mounted. The printed circuit board PCB is a component which transmits a signal for driving the display element from the control unit to the display element. Even though in FIG. 1, it is described that one printed circuit board PCB is used, the number of printed circuit boards PCB is not limited thereto.

Hereinafter, the stretchable display device 100 according to the embodiment of the present disclosure will be described in more detail with reference to FIGS. 2 and 3.

Planar and Cross-Sectional Structures

Figure 2:
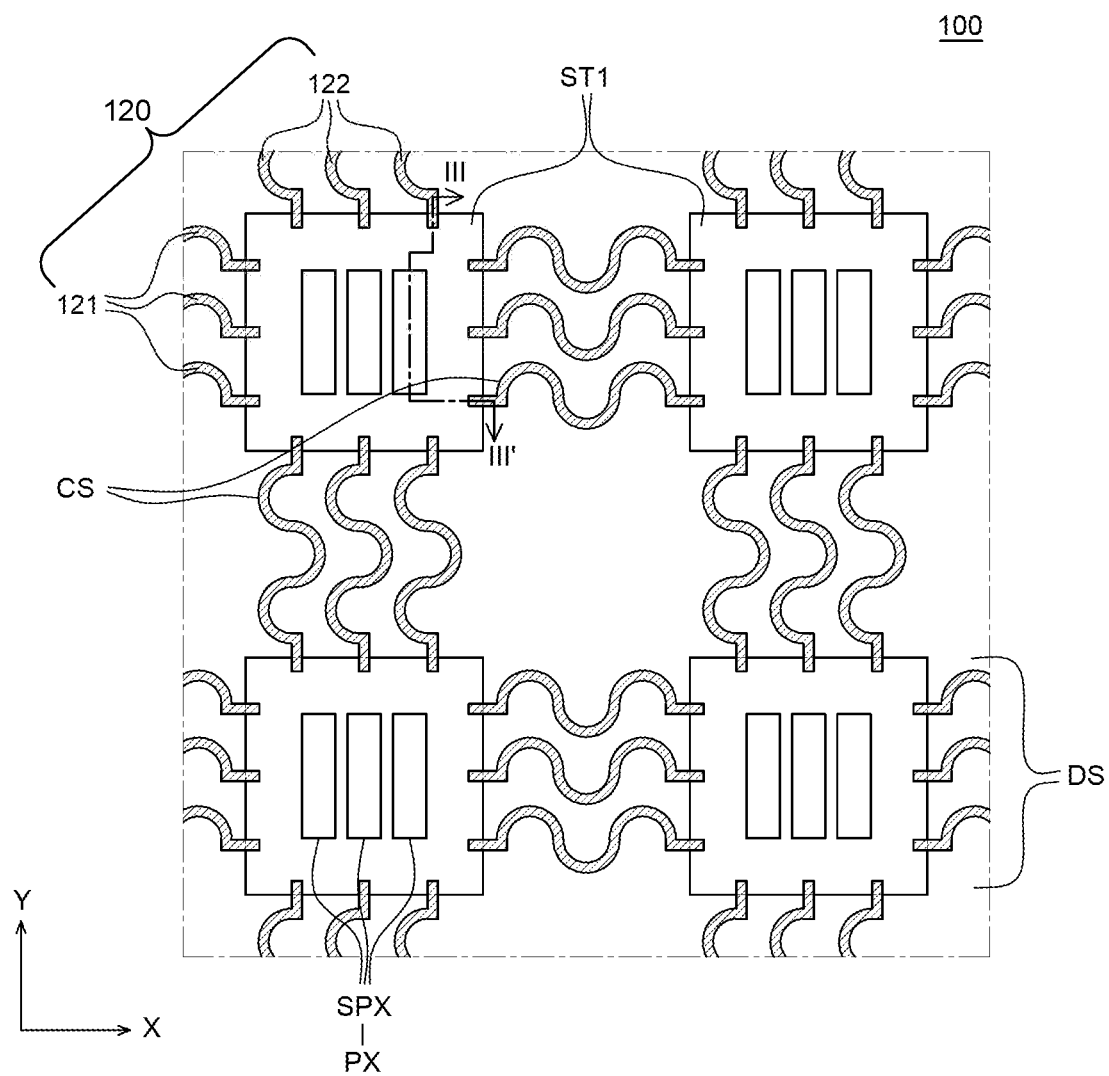
FIG. 2 is an enlarged plan view of a stretchable display device according to an embodiment of the present disclosure.

FIG. 2 is an enlarged plan view of a stretchable display device according to an embodiment of the present disclosure. FIG. 3 is a cross-sectional view taken along the line of FIG. 2. For the convenience of description, the stretchable display device 100 according to the embodiment of the present disclosure will be described with reference to FIG. 1 together.

Figure 3:
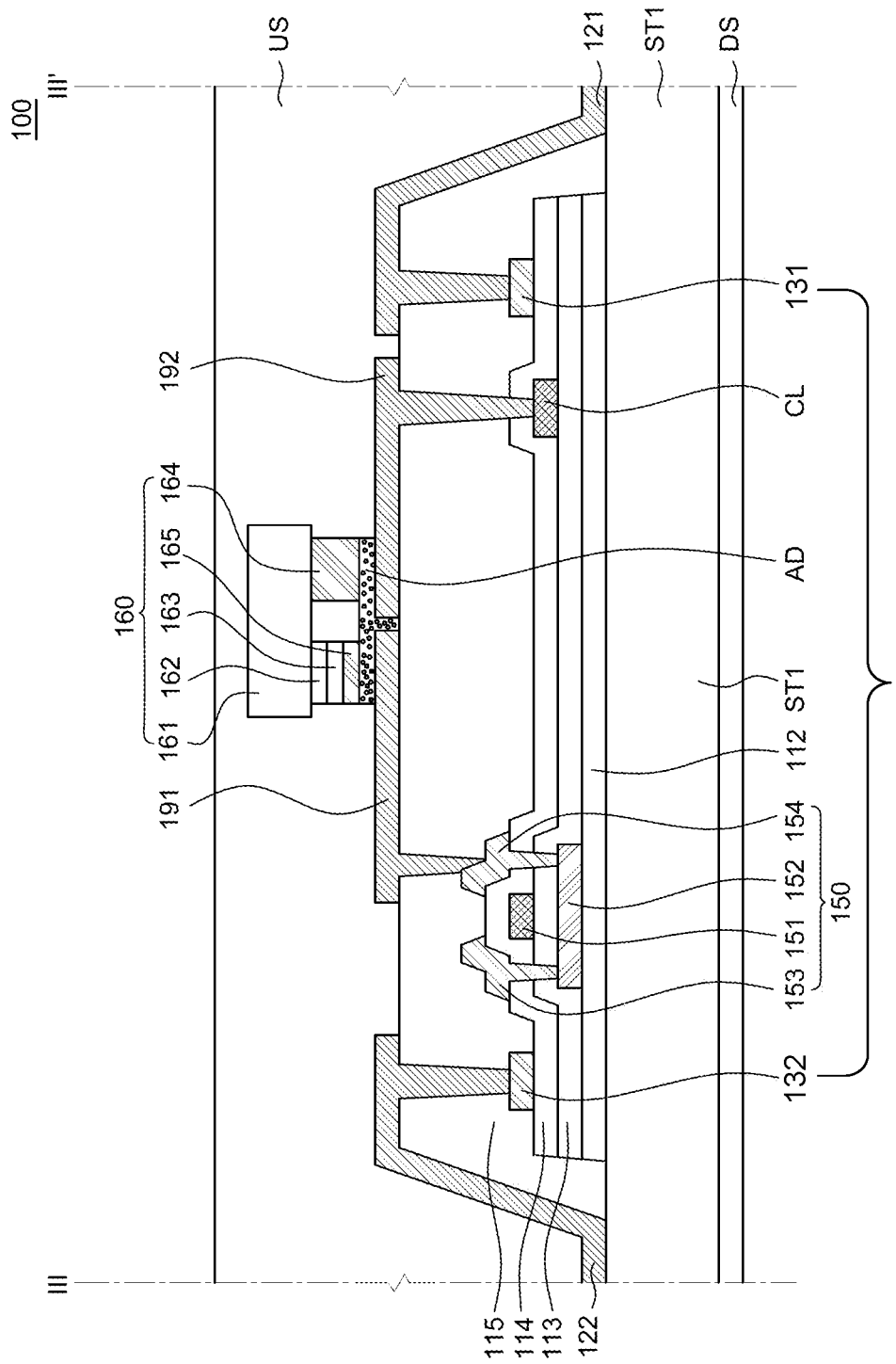
FIG. 3 is a cross-sectional view taken along the line of FIG. 2.

Referring to FIGS. 2 and 3, the stretchable display device 100 includes a lower substrate DS, a plurality of first substrates ST1, a plurality of connection substrates CS, a plurality of connection lines 120, a plurality of pads 130, a transistor 150, and an LED 160.

Referring to FIGS. 1 and 2, the plurality of first substrates ST1 is disposed on the lower substrate DS in the display area AA. The plurality of first substrates ST1 is spaced apart from each other to be disposed on the lower substrate DS. For example, as illustrated in FIGS. 1 and 2, the plurality of first substrates ST1 may be disposed on the lower substrate DS in a matrix but is not limited thereto.

Referring to FIGS. 1 and 2, a plurality of sub-pixels SPX which configures the plurality of pixels PX is disposed on the plurality of first substrates ST1 and a gate driver GD may be mounted on a second substrate ST2 located at a left side of the display area AA, among the plurality of second substrates ST2. The gate driver GD may be formed on the second substrate ST2 in a gate in panel (GIP) manner when various elements on the first substrate ST1 are manufactured. Therefore, various circuit configurations which configure the gate driver GD, such as various transistors, capacitors, and wiring lines may be disposed on the plurality of second substrates ST2. However, it is not limited thereto and the gate driver GD may be mounted in a chip on film (COF) manner. Further, the plurality of second substrates ST2 is also disposed in the non-display area NA located at a right side of the display area AA and the gate driver GD may be mounted also on the plurality of second substrates ST2 located at the right side of the display area AA.

Referring to FIG. 1, a size of the plurality of second substrates ST2 may be larger than a size of the plurality of first substrates ST1. Specifically, a size of each of the plurality of second substrates ST2 may be larger than a size of each of the plurality of first substrates ST1. As described above, on each of the plurality of second substrates ST2, the gate driver GD is disposed. For example, one stage of the gate driver GD may be disposed on each of the plurality of second substrates ST2. Therefore, an area occupied by various circuit configurations which configure one stage of the gate driver GD may be relatively larger than an area of the first substrate ST1 on which the pixel PX is disposed. As a result, the size of each of the plurality of second substrates ST2 may be larger than the size of each of the plurality of first substrates ST1.

Referring to FIGS. 1 and 2, the plurality of connection substrates CS may be disposed between the plurality of first substrates ST1, between the plurality of second substrates ST2, or between the plurality of first substrates ST1 and the plurality of second substrates ST2. The plurality of connection substrates CS may be substrates which connect adjacent first substrates ST1, adjacent second substrates ST2, or the first substrate ST1 and the second substrate ST2 which are adjacent to each other. The plurality of connection substrates CS may be simultaneously and integrally formed with the same material as the plurality of first substrates ST1 and the plurality of second substrates ST2 but is not limited thereto.

Referring to FIG. 2, the plurality of connection substrates CS has a wavy shape on a flat surface. For example, as illustrated in FIG. 2, the plurality of connection substrates CS may have a sine wave shape. However, the shape of the plurality of connection substrates CS is not limited thereto and for example, the plurality of connection substrates CS may extend with a zigzag pattern or may be formed with various shapes such as a shape extended by connecting a plurality of rhombus-shaped substrates at vertexes. Further, the number and the shape of the plurality of connection substrates CS illustrated in FIG. 2 are illustrative and the number and the shape of the plurality of connection substrates CS may vary depending on the design.

Referring to FIG. 3, a buffer layer 112 is disposed on the plurality of first substrates ST1. The buffer layer 112 is formed on the plurality of first substrates ST1 to protect various components of the stretchable display device 100 from permeation of moisture $H_2O$ and oxygen $O_2$ from the outside of the lower substrate DS and the plurality of first substrates ST1. The buffer layer 112 may be configured by an insulating material and for example, configured by a single layer or a plurality of layers of an inorganic layer formed of silicon nitride (SiNx), silicon oxide (SiOx), and silicon oxynitride (SiON). However, the buffer layer 112 may be omitted depending on a structure or a characteristic of the stretchable display device 100.

The buffer layer 112 may be formed only in an area where the lower substrate DS overlaps with the plurality of first substrates ST1 and the plurality of second substrates ST2. As described above, the buffer layer 112 may be formed of an inorganic material so that the buffer layer 112 may be easily cracked or damaged during a process of extending the stretchable display device 100. In this case, the buffer layer 112 is not formed in an area between the plurality of first substrates ST1 and the plurality of second substrates ST2 but is patterned to have a shape of the plurality of first substrates ST1 and the plurality of second substrates ST2 to be disposed only above the plurality of first substrates ST1 and the plurality of second substrates ST2. In other words, the buffer layer 112 may not be formed on the plurality of connection substrates CS. Therefore, in the stretchable display device 100 according to the embodiment of the present disclosure, the buffer layer 112 is formed only in an area overlapping with the plurality of first substrates ST1 and the plurality of second substrates ST2 which are rigid substrates. Therefore, even though the stretchable display device 100 is bent or extended to be deformed, the damage of the buffer layer 112 may be suppressed.

Referring to FIG. 3, the transistor 150 including a gate electrode 151, an active layer 152, a source electrode 153, and a drain electrode 154 is formed on the buffer layer 112.

First, referring to FIG. 3, the active layer 152 is disposed on the buffer layer 112. For example, the active layer 152 may be formed of an oxide semiconductor, amorphous silicon (a-Si), polycrystalline silicon (poly-Si), an organic semiconductor, or the like.

A gate insulating layer 113 is disposed on the active layer 152. The gate insulating layer 113 is a layer for electrically insulating the gate electrode 151 from the active layer 152 and may be formed of an insulating material. For example, the gate insulating layer 113 may be formed as a single layer of silicon nitride (SiNx) or silicon oxide (SiOx) which is an inorganic material or a multiple layer of silicon nitride (SiNx) or silicon oxide (SiOx) but it is not limited thereto.

The gate electrode 151 is disposed on the gate insulating layer 113. The gate electrode 151 is disposed to overlap with the active layer 152. The gate electrode 151 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple-layer thereof, but it is not limited thereto.

An interlayer insulating layer 114 is disposed on the gate electrode 151. The interlayer insulating layer 114 is a layer which insulates the gate electrode 151 from the source electrode 153 and the drain electrode 154 and is formed of an inorganic material, similarly to the buffer layer 112. For example, the interlayer insulating layer 114 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 which are in contact with the active layer 152, respectively, are disposed on the interlayer insulating layer 114. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

The gate insulating layer 113 and the interlayer insulating layer 114 are patterned to be formed only in an area overlapping with the plurality of first substrates ST1. The gate insulating layer 113 and the interlayer insulating layer 114 are also formed of the inorganic material, similarly to the buffer layer 112, so that the gate insulating layer 113 and the interlayer insulating layer 114 may also be easily cracked to be damaged during the process of extending the stretchable display device 100. Therefore, the gate insulating layer 113 and the interlayer insulating layer 114 are not formed in an area between the plurality of first substrates ST1 but are patterned to have a shape of the plurality of first substrates ST1 to be formed only above the plurality of first substrates ST1.

In FIG. 3, even though among various transistors which may be included in the stretchable display device 100, only a driving transistor is illustrated for the convenience of description, a switching transistor or a capacitor may also be included in the display device. Further, in this specification, even though it is described that the transistor 150 has a coplanar structure, various transistors such as a staggered structure may also be used.

Referring to FIG. 3, a plurality of pads 130 is disposed on the interlayer insulating layer 114. In the drawing, even though it is illustrated that the plurality of pads 130 is disposed on the first substrates ST1, the plurality of pads 130 may also be disposed on the second substrates ST2. The plurality of pads 130 may be pads which transmit any one of various signals such as a gate signal, a data signal, an emission signal, a high potential power signal, a low potential power signal, a reference voltage signal, and a compensation signal to the plurality of sub-pixels SPX, but is not limited thereto. The plurality of pads 130 may be formed of the same material as the source electrode 153 and the drain electrode 154 but is not limited thereto.

The plurality of pads 130 includes a first pad 131 and a second pad 132. The first pad 131 may be connected to a first connection line 121. The second pad 132 may be connected to a second connection line 122.

Referring to FIG. 3, a planarization layer 115 is formed on the transistor 150 and the interlayer insulating layer 114. The planarization layer 115 planarizes an upper portion of the transistor 150. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic organic material but is not limited thereto.

Referring to FIG. 3, the planarization layer 115 is disposed on the plurality of first substrates ST1 to cover top surfaces and side surfaces of the buffer layer 112, the gate insulating layer 113, and the interlayer insulating layer 114. By doing this, the planarization layer 115 encloses the buffer layer 112, the gate insulating layer 113, and the interlayer insulating layer 114 together with the plurality of first substrates ST1. In some embodiments, the term "cover" includes the meaning of "on." Specifically, the planarization layer 115 may be disposed so as to cover a top surface and a side surface of the interlayer insulating layer 114, a side surface of the gate insulating layer 113, a side surface of the buffer layer 112, and a part of a top surface of the plurality of first substrates ST1.

The planarization layer 115 may supplement a step on the side surfaces of the buffer layer 112, the gate insulating layer 113, and the interlayer insulating layer 114 and enhance an adhesive strength of the planarization layer 115 and the connection line 120 disposed on the side surface of the planarization layer 115. For example, the side surface of the planarization layer 115 may have a slope which is gentler than a slope formed by a side surface of the interlayer insulating layer 114, a side surface of the gate insulating layer 113, and a side surface of the buffer layer 112. Therefore, the connection line 120 which is disposed to be in contact with the side surface of the planarization layer 115 is disposed with a gentle slope so that when the stretchable display device 100 is extended, a stress generated in the connection line 120 is reduced. Further, the crack occurring in the connection line 120 or a separation from the side surface of the planarization layer 115 may be suppressed.

In some embodiments, a passivation layer may be formed between the transistor 150 and the planarization layer 115. That is, the passivation layer may be formed to cover the transistor 150 to protect the transistor 150 from the permeation of the moisture and oxygen. The passivation layer may be formed of an inorganic material and configured by a single layer or a plurality of layers, but is not limited thereto.

Referring to FIG. 3, a common line CL is disposed on the gate insulating layer 113. The common line CL is a wiring line which applies a common voltage to the plurality of sub-pixels SPX. The common line CL may be formed of the same material as the gate electrode 151 of the transistor 150 but is not limited thereto.

Referring to FIG. 3, a first connection pad 191 and a second connection pad 192 are disposed on the planarization layer 115. The first connection pad 191 is an electrode which electrically connects an LED 160 to be described below and the transistor 150. For example, the first connection pad 191 may electrically connect the drain electrode 154 of the transistor 150 and the LED 160 through a contact hole formed in the planarization layer 115.

The second connection pad 192 is an electrode which electrically connects the LED 160 and the common line CL. For example, the second connection pad 192 may electrically connect the common line CL and the LED 160 through the contact hole formed in the planarization layer 115.

Referring to FIG. 3, the LED 160 is disposed on the first connection pad 191 and the second connection pad 192. The LED 160 includes an n-type layer 161, an active layer 162, a p-type layer 163, an n-electrode 164, and a p-electrode 165. The LED 160 of the stretchable display device 100 according to the embodiment of the present disclosure has a flip-chip structure in which the n-electrode 164 and the p-electrode 165 are formed on one surface.

The n-type layer 161 may be formed by injecting an n-type impurity into gallium nitride (GaN). The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the LED 160 according to the embodiment of the present disclosure may be manufactured by sequentially laminating the n-type layer 161, the active layer 162, and the p-type layer 163, and then etching a predetermined part to form the n-electrode 164 and the p-electrode 165. In this case, the predetermined part which is a space for separating the n-electrode 164 and the p-electrode 165 from each other may be etched to expose a part of the n-type layer 161. In other words, the surfaces of the LED 160 on which the n-electrode 164 and the p-electrode 165 are disposed are not flat surfaces but have different heights.

As described above, in the etched area, in other words, on the n-type layer 161 exposed by the etching process, the n-electrode 164 is disposed. The n-electrode 164 may be formed of a conductive material. In the meantime, in an area which is not etched, in other words, on the p-type layer 163, the p-electrode 165 is disposed. The p-electrode 165 is also formed of a conductive material, and for example, may be formed of the same material as the n-electrode 164. The p-electrode 165 and the n-electrode 164 described above may be defined as a first electrode and a second electrode of the LED 160, respectively.

An adhesive layer AD is disposed on top surfaces of the first connection pad 191 and the second connection pad 192 and between the first connection pad 191 and the second connection pad 192 so that the LED 160 may be bonded onto the first connection pad 191 and the second connection pad 192. In this case, the n-electrode 164 may be disposed on the second connection pad 192 and the p-electrode 165 may be disposed on the first connection pad 191.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulating property. For example, the n-electrode 164 is electrically connected to the second connection line 122 by means of the adhesive layer AD, and the p-electrode 165 is electrically connected to the first connection line 121 by means of the adhesive layer AD. That is, after applying the adhesive layer AD on the first connection pad 191 and the second connection pad 192 using an inkjet method, the LED 160 is transferred onto the adhesive layer AD and the LED 160 is pressurized and heated. By doing this, the first connection pad 191 is electrically connected to the p-electrode 165 and the second connection pad 192 is electrically connected to the n-electrode 164. However, the remaining part of the adhesive layer AD excluding a part of the adhesive layer AD disposed between the n-electrode 164 and the second connection pad 192 and a part of the adhesive layer AD disposed between the p-electrode 165 and the first connection pad 191 has an insulating property.

In the meantime, the adhesive layer AD may be divided to be disposed on the first connection pad 191 and the second connection pad 192, respectively. That is, the adhesive layer AD disposed between the p-electrode 165 and the first connection pad 191 may be defined as a first adhesive pattern and the adhesive layer AD disposed between the n-electrode 164 and the second connection pad 192 may be defined as a second adhesive pattern.

As described above, the stretchable display device 100 according to the embodiment of the present disclosure has a structure in which the LED 160 is disposed on the lower substrate DS on which the transistor 150 is disposed. Therefore, when the stretchable display device 100 is turned on, different voltage levels which are applied to the first connection pad 191 and the second connection pad 192, respectively, are transmitted to the n-electrode 164 and the p-electrode 165 so that the LED 160 emits light.

In the meantime, even though in FIG. 3, it is illustrated that a bank is not used, the bank may be formed on the first connection pad 191, the second connection pad 192, the connection line 120, and the planarization layer 115. The bank may divide sub-pixels which are disposed on one side and the other side of the LED 160 to be adjacent to each other. The bank may be formed of an insulating material. Further, the bank may include a black material. The bank includes the black material to block wiring lines which may be visible through the display area AA. For example, the bank may be formed of a transparent carbon-based mixture and specifically, include carbon black. However, it is not limited thereto and the bank may be formed of a transparent insulating material.

Referring to FIGS. 1 and 3, the upper substrate US is disposed on the LED 160 and the lower substrate DS. The upper substrate US is a substrate which supports various components disposed below the upper substrate US. Specifically, the upper substrate US is formed by coating a material which configures the upper substrate US on the lower substrate DS and then curing the material to be disposed to be in contact with the lower substrate DS, the first substrate ST1, the second substrate ST2, and the connection substrate CS.

The upper substrate US which is a flexible substrate may be configured by an insulating material which is bendable or extendable. The upper substrate US is a flexible substrate so as to be reversibly expanded and contracted. Further, an elastic modulus of the upper substrate US may be several MPa to several hundreds of MPa and an extension rupture ratio may be 100% or higher. A thickness of the upper substrate US may be 10 μm to 1 mm but is not limited thereto.

The upper substrate US may be formed of the same material as the lower substrate DS. For example, the upper substrate US may be formed of a silicon rubber such as polydimethylsiloxane (PDMS) or an elastomer such as polyurethane (PU) or polytetrafluoroethylene (PTFE) and thus have a flexible property. However, the material of the upper substrate US is not limited thereto.

Even though not illustrated in FIG. 3, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

Referring to FIGS. 2 and 3, the plurality of connection lines 120 is disposed on the planarization layer 115 and the plurality of connection substrates CS. The plurality of connection lines 120 refers to wiring lines which electrically connect a plurality of pads 130 which is adjacent to each other. In this case, the connection line 120 and the pad 130 may be electrically connected to each other through a contact hole formed in the planarization layer 115. The plurality of connection lines 120 may be configured by one of various wiring lines such as a gate line, a data line, an emission signal line, a high potential power line, a low potential power line, a reference voltage line, and a compensation signal line, but is not limited thereto.

The plurality of connection lines 120 is disposed between two adjacent first substrates ST1 to electrically connect two first substrates ST1. Specifically, the plurality of connection lines 120 is disposed on a top surface and a side surface of the connection substrate CS which connects two adjacent first substrates ST1 and two adjacent second substrates ST2. Further, the plurality of connection lines 120 may be disposed between two adjacent second substrates ST2 and between the first substrate ST1 and the second substrate ST2 which are adjacent to each other.

In an area corresponding to the connection substrate CS, the plurality of connection lines 120 is formed to have the same shape as the plurality of connection substrates CS to overlap with each other. That is, the plurality of connection lines 120 may have the same wavy shape as the plurality of connection substrates CS above the plurality of connection substrates CS.

The plurality of connection lines 120 includes the first connection line 121 and the second connection line 122. The first connection line 121 and the second connection line 122 may be disposed between the plurality of first substrates ST1, between the plurality of second substrates ST2, or between the plurality of first substrates ST1 and the plurality of second substrates ST2.

The first connection line 121 is formed to extend to the top surface and the side surface of the connection substrate CS while being in contact with a top surface and a side surface of the planarization layer 115 disposed on the first substrate ST1. Further, the second connection line 122 is formed to extend to the top surface and the side surface of the connection substrate CS while being in contact with the top surface and the side surface of the planarization layer 115 disposed on the first substrate ST1.

In FIGS. 1 and 2, the first connection line 121 refers to a wiring line extending in an X-axis direction among the plurality of connection lines 120, and the second connection line 122 refers to a wiring line extending in a Y-axis direction among the plurality of connection lines 120. The first connection line 121 and the second connection line 122 may be configured to transmit different signals to the plurality of sub-pixels SPX. That is, a signal transmitted by the first connection line 121 may be different from a signal transmitted by the second connection line 122.

The plurality of connection lines 120 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

The display device includes various signal lines such as a gate line, a data line, an emission signal line, a high potential power line, a low potential power line, a reference voltage line, or a compensation signal line. In the case of a general display device, various signal lines are disposed to extend as a straight line between the plurality of sub-pixels and the plurality of sub-pixels is connected to one signal line. Therefore, in the general display device, various signal lines may extend from one side of the display device to the other side without being disconnected on the substrate.

In contrast, in the case of the stretchable display device 100 according to the embodiment of the present disclosure, a straight signal line which is considered to be used for the general display device is disposed only on the plurality of first substrates ST1 and the plurality of second substrates ST2. That is, in the stretchable display device 100 according to the embodiment of the present disclosure, a straight signal line may be disposed only on the plurality of first substrates ST1 and the plurality of second substrates ST2.

In the stretchable display device 100 according to the embodiment of the present disclosure, in order to connect discontinuous wiring lines on the first substrate ST1 or the second substrate ST2, the pads 130 on the adjacent substrates ST1 and ST2 may be connected by the connection lines 120. That is, the connection line 120 electrically connects pads 130 on two adjacent first substrates ST1, on two adjacent second substrates ST2, and on the first substrate ST1 and the second substrate ST2. Therefore, in the stretchable display device 100 according to the embodiment of the present disclosure, straight signal lines on the plurality of first substrates ST1 and the plurality of second substrates ST2 may be electrically connected to each other by the plurality of connection lines 120.

For example, the gate line may be disposed on the plurality of first substrates ST1 disposed to be adjacent to each other in the X-axis direction and the gate pad may be disposed on both ends of the gate line. For example, the first pad 131 may be one of the gate pads disposed on both ends of the gate line of the sub-pixel SPX. The first connection line 121 may serve as a gate line. The plurality of first pads 131 on the plurality of first substrates ST1 which are disposed to be adjacent to each other in the X-axis direction may be connected to each other by the first connection line 121 on the connection substrate CS. Therefore, the gate line disposed on the plurality of first substrates ST1 and the first connection line 121 disposed on the connection substrate CS may serve as one gate line. Accordingly, one gate signal may be transmitted to the gate electrode 151 of the plurality of sub-pixels SPX through the first pad 131, the first connection line 121, and the gate lines disposed on the plurality of first substrates ST1.

Further, the data line may be disposed on the plurality of first substrates ST1 disposed to be adjacent to each other in the Y-axis direction and a data pad may be disposed on both ends of the data line. For example, the second pad 132 may be one of the data pads disposed on both ends of the data line of the sub-pixel SPX. The second connection line 122 may serve as a data line. The plurality of second pads 132 on the plurality of first substrates ST1 which are adjacent to each other in the Y-axis direction may be connected to each other by the second connection line 122 on the connection substrate CS. Therefore, the data line disposed on the plurality of first substrates ST1 and the second connection line 122 disposed on the connection substrate CS may serve as one data line. Accordingly, one data signal may be transmitted to the plurality of sub-pixels SPX through the second pad 132, the second connection line 122, and the data lines disposed on the plurality of first substrates ST1.

Further, the connection line 120 may further include a wiring line which connects pads on the plurality of first substrates ST1 and the plurality of second substrates ST2 to each other or connects pads on two second substrates ST2 which are disposed to be parallel, among pads on the plurality of second substrates ST2 adjacent in the Y-axis direction.

Shape of Connection Line

Figure 4:
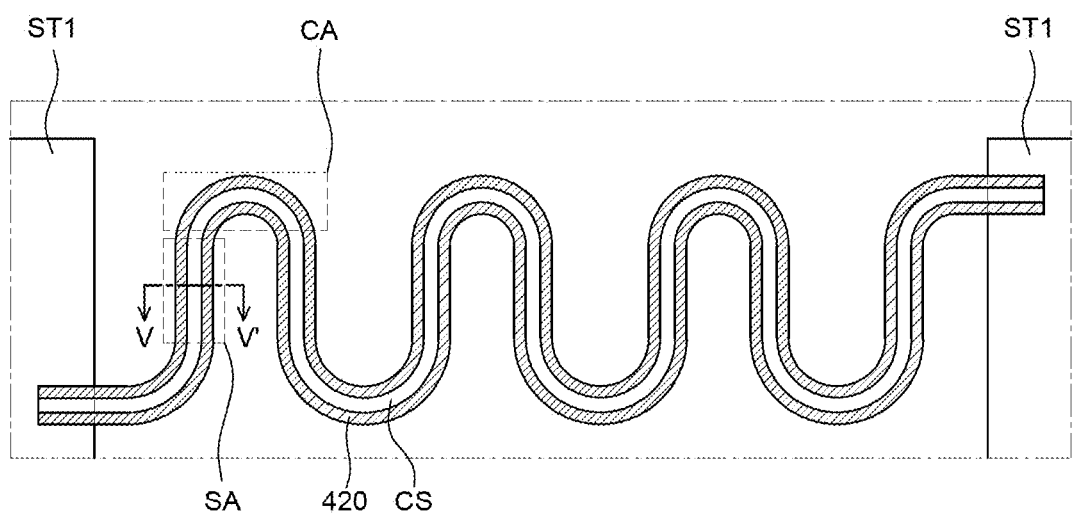
FIG. 4 is a plan view illustrating a connection line of a stretchable display device according to an embodiment of the present disclosure.
Figure 5:
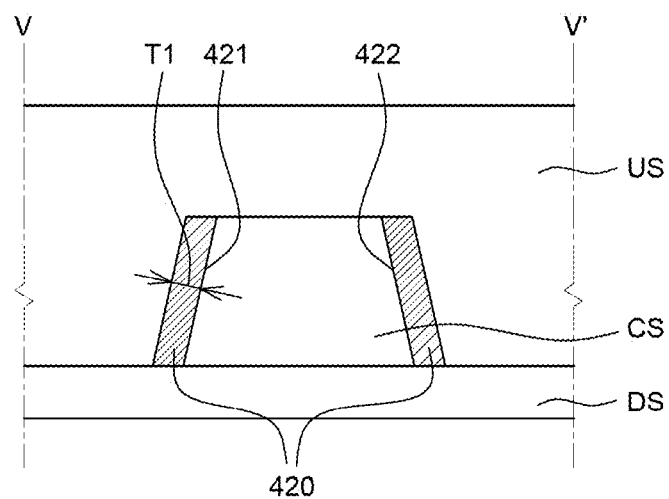
FIG. 5 is a cross-sectional view taken along the line V-V' of FIG. 4.

FIG. 4 is a view illustrating a connection line of a stretchable display device according to an embodiment of the present disclosure. FIG. 5 is a cross-sectional view taken along the line V-V' of FIG. 4.

Even though a shape of the connection line illustrated in FIG. 4 is partially different from a shape of the connection line illustrated in FIG. 2, for the convenience of description, a shape of the connection line will be described with reference to the connection line illustrated in FIG. 4. Further, the first connection line and the second connection line are disposed in different directions, but substantially have the same shape, so that the first connection line and the second connection line may be collectively described as a connection line.

Referring to FIG. 4, a plurality of connection substrates CS and a plurality of connection lines 420 have wavy shapes, respectively. As described above, the plurality of connection substrates CS and the plurality of connection lines 420 may have various shapes such as a sine wave shape or a zigzag pattern.

Therefore, the plurality of connection substrates CS and the plurality of connection lines 420 may be disposed in a linear area SA and a non-linear area CA, respectively. In some embodiments, the linear area SA may be referred to as a straight area SA and the non-linear area CA may be referred to as a curved area CA. That is, areas where the plurality of connection substrates CS and the plurality of connection lines 420 are disposed may be divided into the straight area SA and the curved area CA. In the straight area SA, each of the plurality of connection substrates CS and the plurality of connection lines 420 may extend in a straight line without being bent or in a substantially straight line. Further, in the curved area CA, each of the plurality of connection substrates CS and the plurality of connection lines 420 may be bent with a selected curvature that does not extend in a straight line. The selected curvature in the curved area CA may be selected or predetermined based on various factors such as the distance between adjacent first substrates ST1, the degree of stretchability, the degree of elasticity, or the like. However, in FIG. 4, it is illustrated that each of the plurality of connection substrates CS and the plurality of connection lines 420 is bent in the curved area CA while maintaining a predetermined curvature. However, the present disclosure is not limited thereto, and depending on the necessity for a design, each of the plurality of connection substrates CS and the plurality of connection lines 420 may be bent in the curved area CA while maintaining a variable curvature or curved at a predetermined angle.

Referring to FIG. 5, the plurality of connection lines 420 may be disposed on both side surfaces, a first side surface 421 and a second side surface 422 of the plurality of connection substrates CS. In some embodiments, each of the plurality of connection lines 420 may be formed as a dual line which is in contact with both the first side surface 421 and the second side surface 422 of the connection substrate CS. That is, in some embodiments, each of the plurality of connection lines 420 is not disposed on the top surface of the connection substrates CS, but may be disposed on both side surfaces of the connection substrates CS with a dual line shape. However, the present disclosure is not limited thereto, and depending on the necessity for a design, the plurality of connection lines 420 may be formed as a single line which is in contact with only one side surface of both side surfaces of the connection substrates CS.

Further, the plurality of connection lines 420 may be in contact with the lower substrate DS but is not limited thereto, and depending on the necessity for a design, the plurality of connection lines 420 may be spaced apart from the lower substrate DS.

A thickness T1 of the plurality of connection lines 420 may be 0.6 μm to 1 μm.

As described above, in the stretchable display device according to the embodiment of the present disclosure, the plurality of connection lines 420 may be formed on both side surfaces of the connection substrate CS as a dual line. By doing this, the plurality of connection lines 420 is connected in parallel so that the line resistance may be sharply reduced. Accordingly, in order to drive the stretchable display device, a delay of a signal which is applied to the connection line 420 may be reduced or minimized. As a result, a display quality of the stretchable display device may be improved.

Further, in the stretchable display device of the related art, the plurality of connection lines is disposed only on a top surface of the connection substrate so that the plurality of connection lines is disposed in a horizontal direction with respect to the lower substrate. By doing this, when the stretchable display device of the related art was extended, an extension stress applied to the plurality of connection lines was measured to be up to 73500 MPa. As a result, in the stretchable display device in the related art, the plurality of connection lines may be highly likely to be cracked, which causes disconnection.

In contrast, in the stretchable display device according to the embodiment of the present disclosure, the plurality of connection lines 420 is disposed on both side surfaces of the connection substrate CS to dispose the plurality of connection lines 420 in a direction perpendicular to the lower substrate DS. That is, the position of the plurality of connection lines 420 may be closer to a curvature center axis of a wavy shape of the plurality of connection lines 420. By doing this, when the stretchable display device according to the embodiment of the present disclosure is extended, an extension stress applied to the plurality of connection lines 420 is measured to be up to 692 MPa. That is, the extension stress applied to the plurality of connection lines 420 is reduced by up to 100 times at the same extension rate. Therefore, the stretchable display device according to the embodiment of the present disclosure may solve the disconnection problem of the connection lines 420, which results in improvement of the extension reliability of the stretchable display device.

Figure 6:
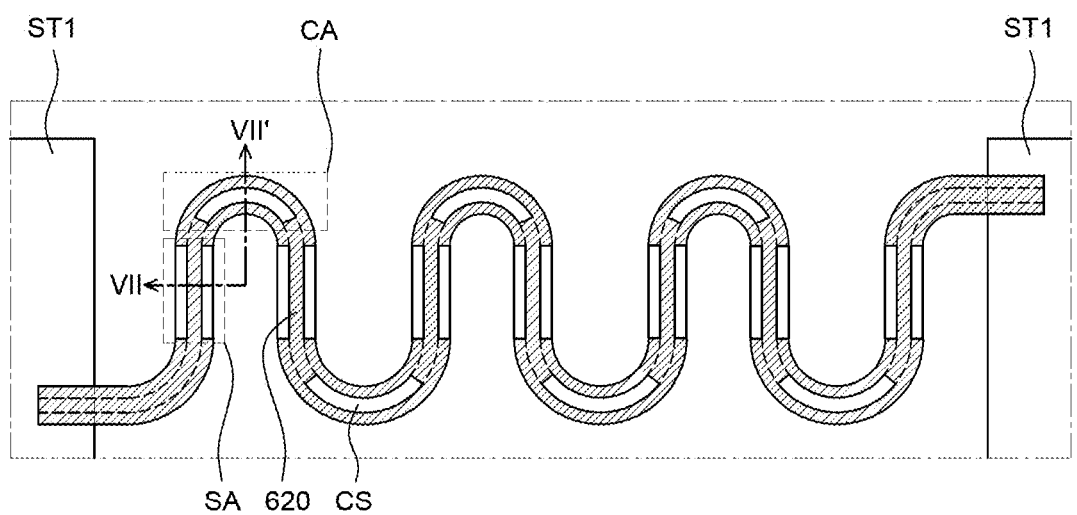
FIG. 6 is a plan view illustrating a connection line of a stretchable display device according to another embodiment of the present disclosure.
Figure 7:
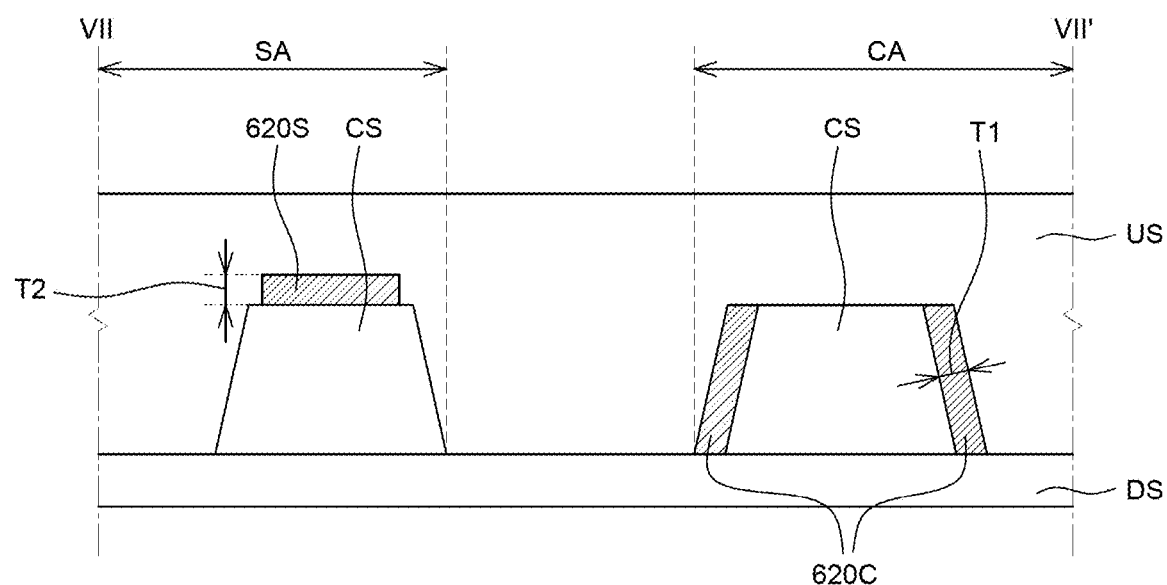
FIG. 7 is a cross-sectional view taken along the line VII-VII' of FIG. 6.

FIG. 6 is a view illustrating a connection line of a stretchable display device according to another embodiment of the present disclosure. FIG. 7 is a cross-sectional view taken along the line VII-VII' of FIG. 6.

Only difference between the stretchable display device according to the embodiment of the present disclosure and a stretchable display device according to another embodiment of the present disclosure is the arrangement of the connection line. Therefore, a redundant description will be omitted and the arrangement of the connection will be described in detail.

As illustrated in FIG. 6, a connection line 620 of the stretchable display device according to another embodiment of the present disclosure has different shapes in a straight area SA and a curved area CA.

The connection line 620 includes a plurality of connection lines 620C disposed in the curved area CA and a plurality of connection lines 620S disposed in the straight area SA. That is, referring to FIG. 7, a plurality of connection lines 620C disposed in the curved area CA is disposed only on both side surfaces of the connection substrate CS and a plurality of connection lines 620S disposed in the straight area SA is disposed only on a top surface of the connection substrate CS. That is, the plurality of connection lines 620C disposed in the curved area CA is disposed on both side surfaces of the connection substrate CS as a dual line and a plurality of connection lines 620S disposed in the straight area SA is disposed on the top surface of the connection substrate CS as a single line.

When the stretchable display device is extended, an extension stress which is applied to the curved area CA is relatively higher than that of the straight area SA. Therefore, the plurality of connection lines 620C disposed in the curved area CA is very highly likely to be cracked. Therefore, in the stretchable display device according to the embodiment of the present disclosure, the plurality of connection lines 620C is disposed only on both side surfaces of the connection substrate CS in the curved area CA. Therefore, the plurality of connection lines 620C may be disposed to be perpendicular to the lower substrate DS in the curved area CA. That is, the position of the plurality of connection lines 620C may be closer to a curvature center axis of a wavy shape of the plurality of connection lines 620C. Therefore, the stretchable display device of the present disclosure may withstand a high stress in the curved area CA so that the extension rate may be improved.

Further, a thickness T2 of the connection line 620S disposed in the straight area SA and a thickness T1 of the connection line 620C disposed in the curved area CA may be different from each other. That is, the thickness T1 of the connection line 620C disposed in the curved area CA may be smaller than the thickness T2 of the connection line 620S disposed in the straight area SA. Therefore, the thickness T1 of the connection line 620C disposed in the curved area CA is relatively small so that the stretchable display device of the present disclosure may withstand a relatively high stress in the curved area CA which is more vulnerable to the extension stress than the straight area SA. Therefore, the extension rate may be improved.

Figure 8:
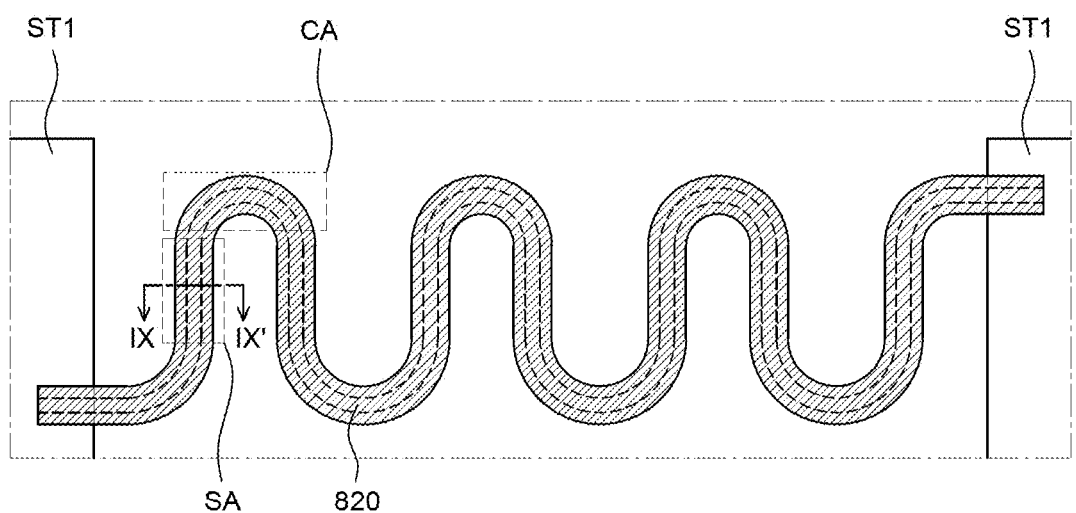
FIG. 8 is a plan view illustrating a connection line of a stretchable display device according to still another embodiment of the present disclosure.
Figure 9:
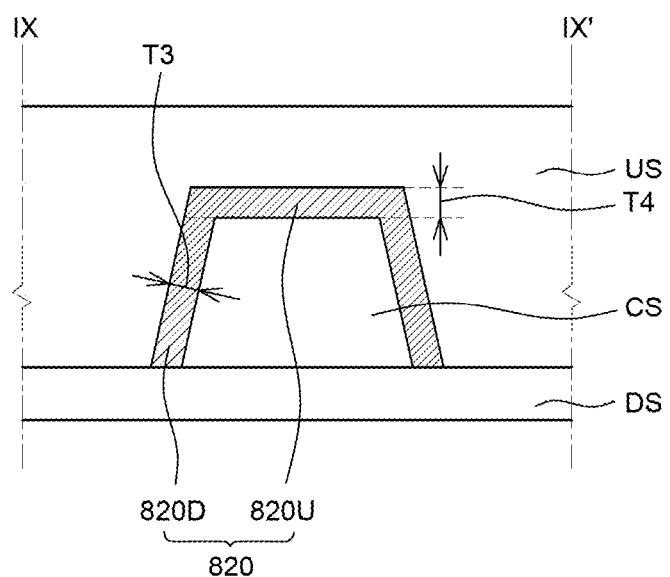
FIG. 9 is a cross-sectional view taken along the line IX-IX' of FIG. 8.

FIG. 8 is a view illustrating a connection line of a stretchable display device according to still another embodiment of the present disclosure. FIG. 9 is a cross-sectional view taken along IX-IX' of FIG. 8.

Only difference between the stretchable display device according to the embodiment of the present disclosure and a stretchable display device according to still another embodiment of the present disclosure is a shape of the connection line. Therefore, a redundant description will be omitted and the shape of the connection will be described in detail.

Referring to FIGS. 8 and 9, a plurality of connection lines 820 may be disposed not only on both side surfaces of the plurality of connection substrates CS, but also above the plurality of connection substrates CS. That is, the plurality of connection lines 820 may be disposed to cover an external surface of the connection substrates CS, respectively. In other words, the plurality of connection lines 820 may be divided into an upper connection line 820U disposed on a top surface of the plurality of connection substrates CS and a lower connection line 820D disposed on both side surfaces of the plurality of connection substrates CS.

The plurality of connection lines 820 may be in contact with the lower substrate DS. However, it is not limited thereto and the plurality of connection lines 820 may be spaced apart from the lower substrate DS depending on the necessity of a design.

A thickness T3 of the lower connection line 820D disposed on both side surfaces of the plurality of connection substrates CS may be different from a thickness T4 of the upper connection line 820U disposed on the top surface of the plurality of connection substrates CS. That is, the thickness T3 of the lower connection line 820D may be smaller than the thickness T4 of the upper connection line 820U. For example, the thickness T3 of the lower connection line 820D may be 0.3 µm to 0.4 µm and the thickness T4 of the upper connection line 820U may be 0.6 µm to 1 µm.

As described above, in the stretchable display device according to still another embodiment of the present disclosure, the plurality of connection lines 820 may be formed to cover the external surface of the connection substrate CS. By doing this, a cross-sectional area of the plurality of connection lines 820 is increased so that the line resistance may be sharply reduced. Accordingly, in order to drive the stretchable display device, a delay of a signal which is applied to the connection line 820 may be reduced or minimized. As a result, a display quality of the stretchable display device may be improved.

Figure 10:
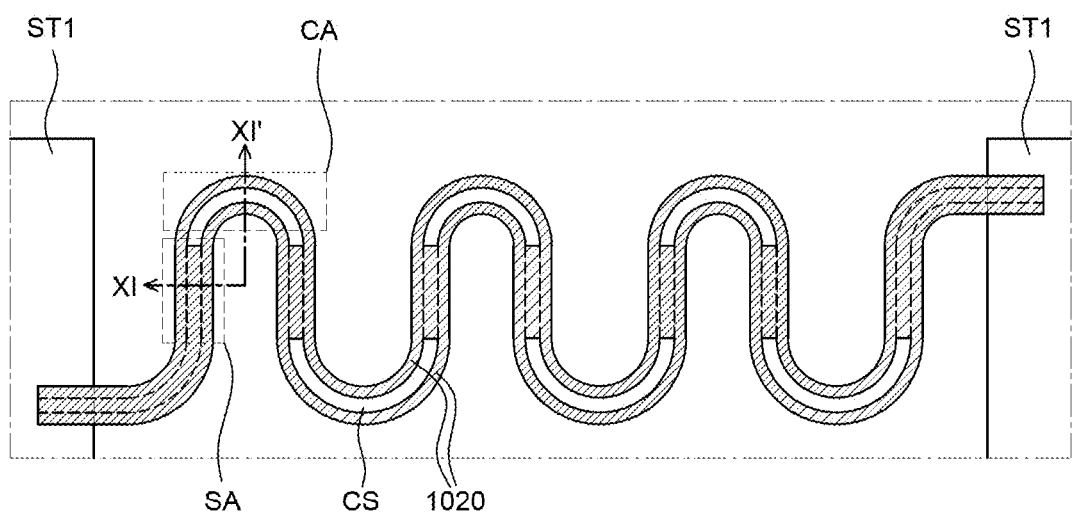
FIG. 10 is a plan view illustrating a connection line of a stretchable display device according to still another embodiment of the present disclosure.
Figure 11:
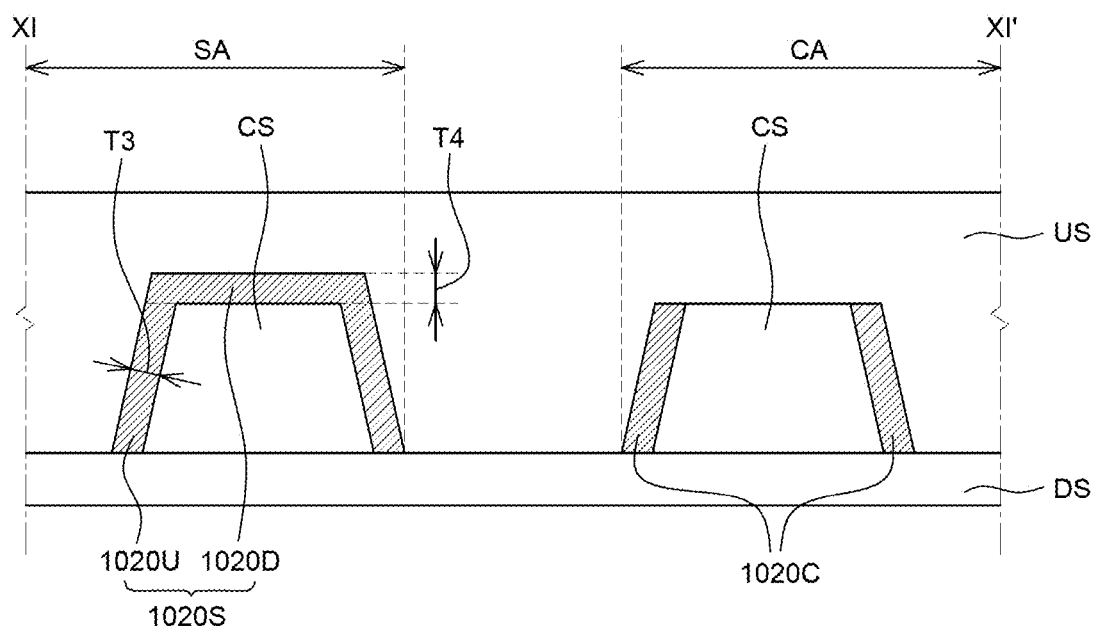
FIG. 11 is a cross-sectional view taken along the line XI-XI' of FIG. 10.

FIG. 10 is a view illustrating a connection line of a stretchable display device according to still another embodiment of the present disclosure. FIG. 11 is a cross-sectional view of a display device taken along the line XI-XI' of FIG. 10.

Only difference between the stretchable display device according to the embodiment of the present disclosure and a stretchable display device according to still another embodiment of the present disclosure is the arrangement of the connection line 1020. Therefore, a redundant description will be omitted and the arrangement of the connection will be described in detail.

As illustrated in FIG. 10, a connection line 1020 of the stretchable display device according to another embodiment of the present disclosure has different shapes in a straight area SA and a curved area CA.

The connection line 1020 includes a plurality of connection lines 1020S disposed in the straight area SA and a plurality of connection lines 1020C disposed in the curved area CA. That is, referring to FIG. 11, a plurality of connection lines 1020S disposed in the straight area SA is disposed on both side surfaces and a top surface of the connection substrate CS and a plurality of connection lines 1020C disposed in the curved area CA is disposed only on both side surfaces of the connection substrate CS. That is, the plurality of connection lines 1020S disposed in the straight area SA may be disposed to cover the external surface of the connection substrate CS, but a plurality of connection lines 1020C disposed in the curved area CA may be disposed on both side surfaces of the connection substrate CS as a dual line.

In other words, the plurality of connection lines 1020S disposed in the straight area SA may be divided into an upper connection line 1020U disposed on a top surface of the plurality of connection substrates CS and a lower connection line 1020D disposed on both side surfaces of the plurality of connection substrates CS.

When the stretchable display device is extended, an extension stress which is applied to the curved area CA is relatively higher than that of the straight area SA. Therefore, the plurality of connection lines 1020C disposed in the curved area CA is very highly likely to be cracked. Therefore, in the stretchable display device according to the embodiment of the present disclosure, the plurality of connection lines 1020 is disposed only on both side surfaces of the connection substrate CS in the curved area CA. Therefore, the plurality of connection lines 1020C may be disposed to be perpendicular to the lower substrate DS in the curved area CA. That is, the position of the plurality of connection lines 1020C may be closer to a curvature center axis of a wavy shape of the plurality of connection lines 1020C. Therefore, the stretchable display device of the present disclosure may withstand high stress in the curved area CA so that the extension rate may be improved.

Figure 12:
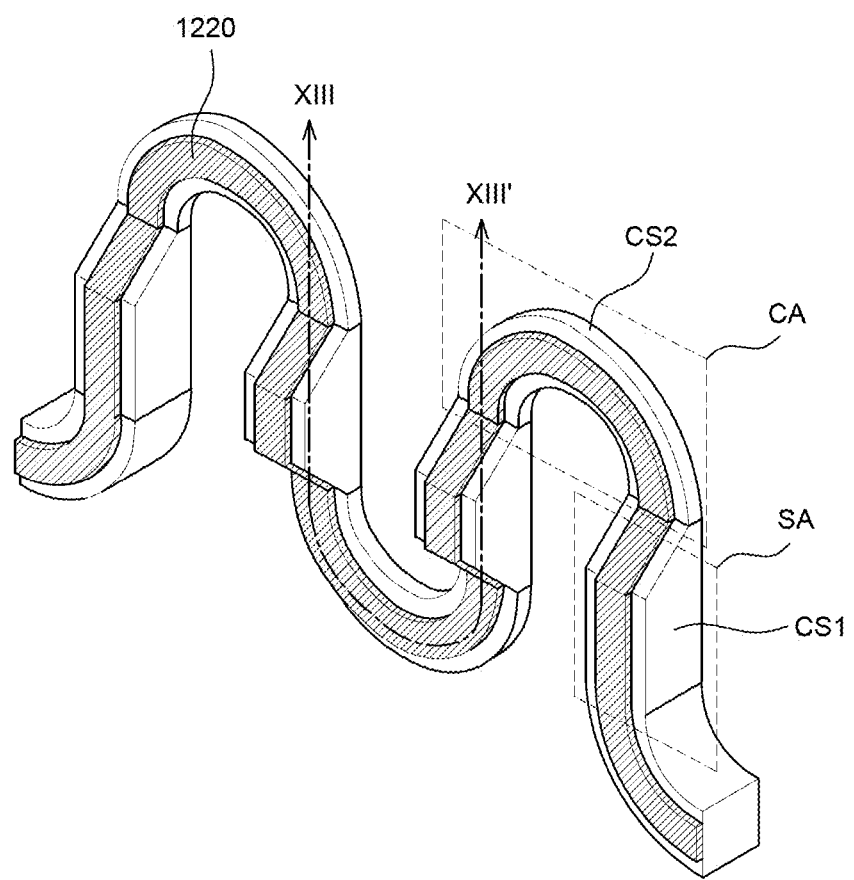
FIG. 12 is a perspective view illustrating a connection line of a stretchable display device according to still another embodiment of the present disclosure.
Figure 13:
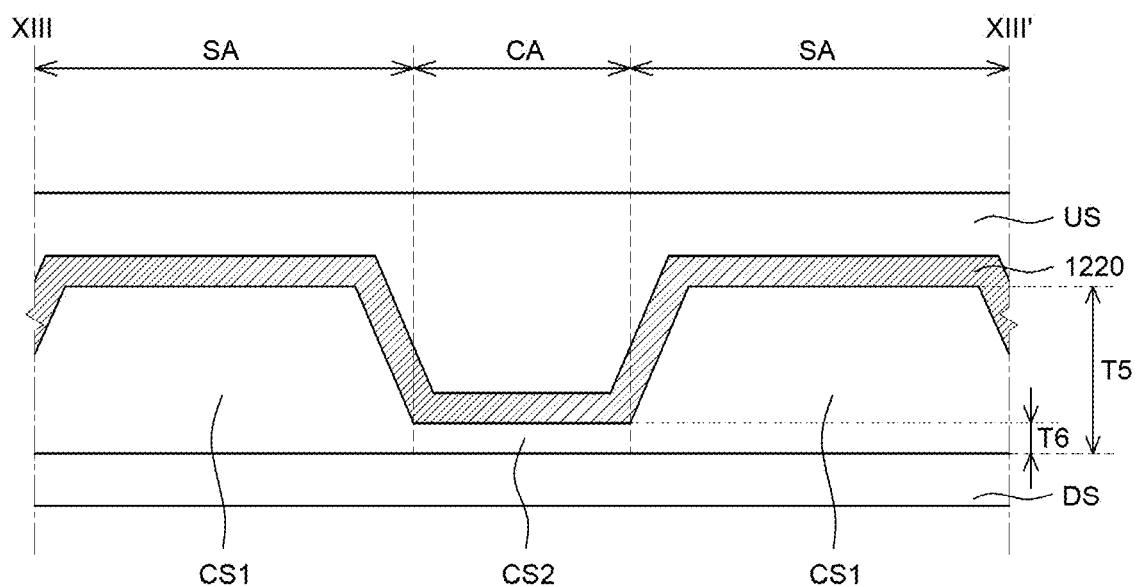
FIG. 13 is a cross-sectional view taken along the line XIII-XIII' of FIG. 12.
Figure 14A:
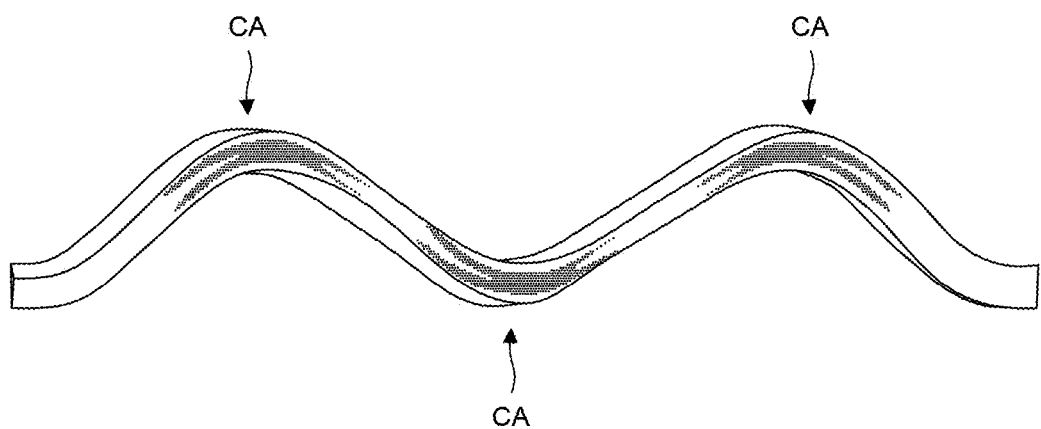
FIG. 14A is a simulation result obtained by measuring an extension stress of a stretchable display device of the related art.
Figure 14B:
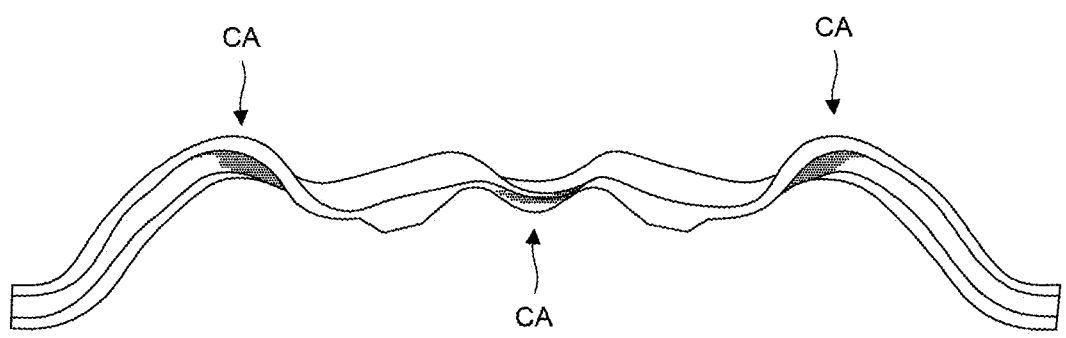
FIG. 14B is a simulation result obtained by measuring an extension stress of a stretchable display device according to still another embodiment of the present disclosure.

FIG. 12 is a perspective view illustrating a connection line of a stretchable display device according to still another embodiment of the present disclosure. FIG. 13 is a cross-sectional view taken along the line XIII-XIII' of FIG. 12. FIG. 14A is a simulation result obtained by measuring an extension stress of a stretchable display device of the related art. FIG. 14B is a simulation result obtained by measuring an extension stress of a stretchable display device according to still another embodiment of the present disclosure.

Since a stretchable display device according to still another embodiment of the present disclosure has a technical feature in connection substrates CS1 and CS2, the connection substrates CS1 and CS2 will be described in detail.

As illustrated in FIGS. 12 and 13, the connection substrates CS1 and CS2 of the stretchable display device according to still another embodiment of the present disclosure have different thicknesses in a straight area SA and a curved area CA.

That is, referring to FIG. 13, a plurality of first connection substrates CS1 disposed in the straight area SA may be formed to be thicker than a plurality of second connection substrates CS2 disposed in the curved area CA. That is, a thickness T5 of each of the plurality of first connection substrates CS1 disposed in the straight area SA may be larger than a thickness T6 of each of the plurality of second connection substrates CS2 disposed in the curved area CA.

However, a connection line 1220 disposed on the plurality of first connection substrates CS1 disposed in the straight area SA and a connection line 1220 disposed on the plurality of second supports CS2 disposed in the curved area CA may be formed to have the same thickness.

Therefore, components disposed in the straight area SA may be relatively thicker than components disposed in the curved area CA.

In the case of the stretchable display device of the related art, a thickness of the straight area SA and a thickness of the curved area CA are uniform so that stress is concentrated on the curved area CA illustrated in FIG. 14A, but is not easily modified. Accordingly, since a vertical modification in the curved area CA of the stretchable display device of the related art is limited, an extension direction of the stretchable display device of the related art is limited.

In contrast, as illustrated in FIG. 14B, in the stretchable display device according to still another embodiment of the present disclosure, the thickness of the curved area CA is relatively thin, so that the stress may be satisfactorily distributed in the curved area CA. Accordingly, in the stretchable display device according to still another embodiment of the present disclosure, the curved area CA may be easily modified in a vertical direction.

As a result, in the stretchable display device according to still another embodiment of the present disclosure, stress is distributed in all directions so that there is no limitation in an extension direction and an extension reliability is also improved.

Figure 15:
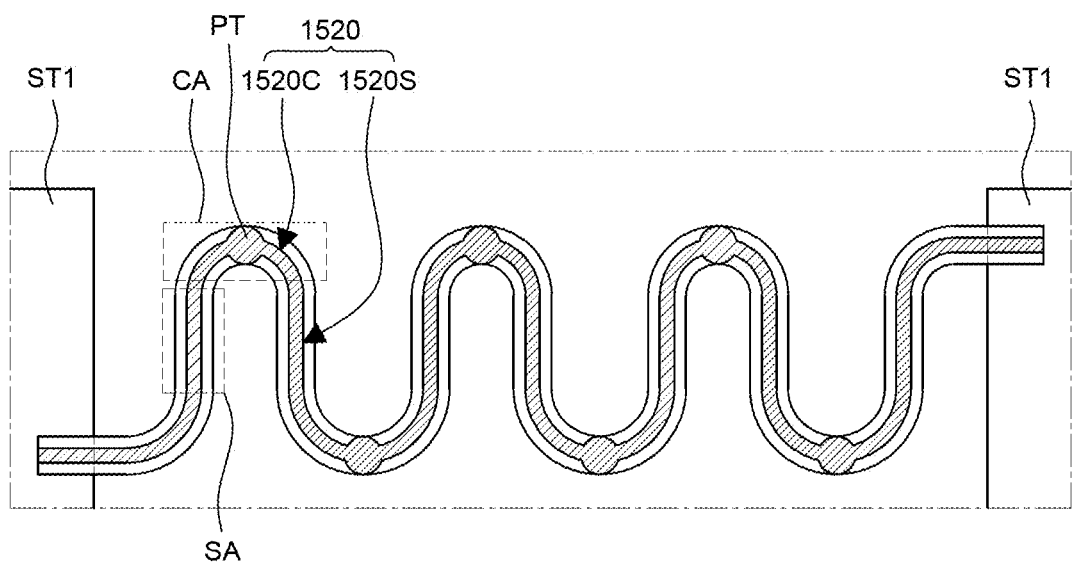
FIG. 15 is a view illustrating a connection line of a stretchable display device according to still another embodiment of the present disclosure.
Figure 16A:
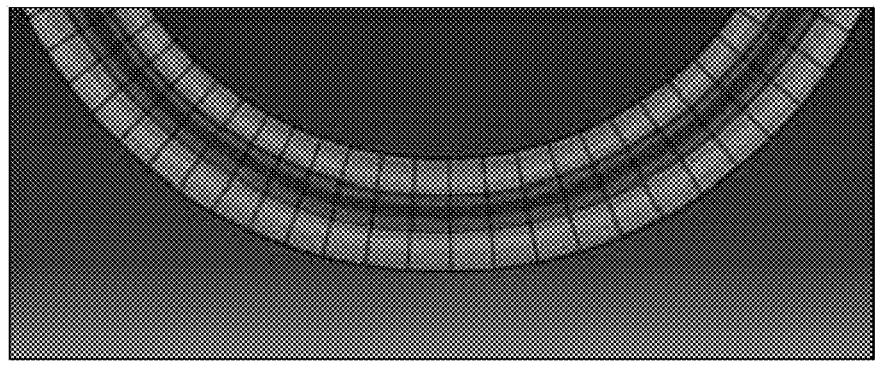
FIG. 16A is a simulation result obtained by measuring an extension stress of a stretchable display device of the related art.
Figure 16B:
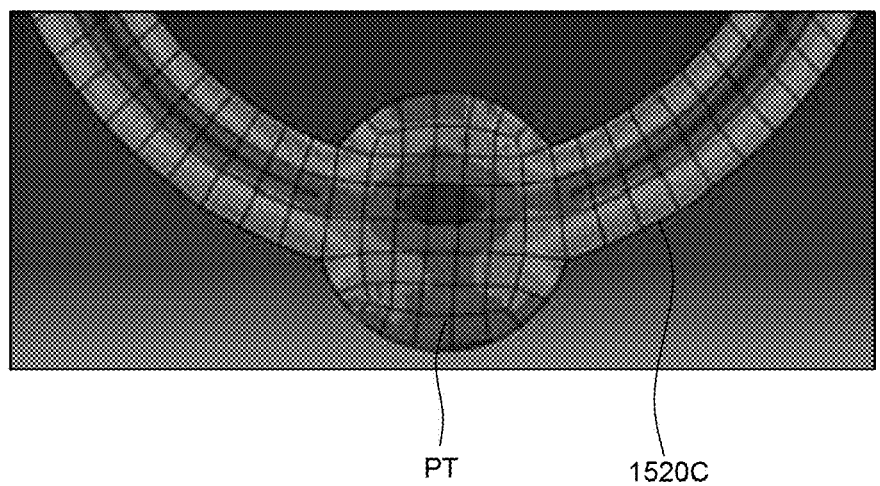
FIG. 16B is a simulation result obtained by measuring an extension stress of a stretchable display device according to still another embodiment of the present disclosure.

FIG. 15 is a view illustrating a connection line of a stretchable display device according to still another embodiment of the present disclosure. FIG. 16A is a simulation result obtained by measuring an extension stress of a stretchable display device of the related art. FIG. 16B is a simulation result obtained by measuring an extension stress of a stretchable display device according to still another embodiment of the present disclosure.

Only difference between the stretchable display device according to the embodiment of the present disclosure and a stretchable display device according to still another embodiment of the present disclosure is a shape of the connection line. Therefore, a redundant description will be omitted and the shape of the connection line will be described in detail.

As illustrated in FIG. 15, a connection line 1520 of the stretchable display device according to still another embodiment of the present disclosure has different shapes in a straight area SA and a curved area CA.

That is, referring to FIG. 15, a plurality of connection lines 1520S disposed in a straight area SA may include straight wiring lines and a plurality of connection lines 1520C disposed in the curved area CA may include curved wiring lines and reinforced patterns PT. In other words, the plurality of connection lines 1520S disposed in the straight area SA may have a straight line shape with a predetermined line width and the plurality of connection lines 1520C disposed in the curved area CA may have a curved shape with a predetermined line width. Further, the reinforced patterns PT may be disposed in a part of the plurality of connection lines 1520C disposed in the curved area CA.

The above-described reinforced pattern PT may have a circular shape and a diameter of the reinforced pattern PT may be larger than a line width of the plurality of connection lines 1520S disposed in the straight area SA. However, the shape of the reinforced pattern PT is not limited to a circular shape, but may be a polygon having a width or a diameter larger than the line width of the plurality of connection lines 1520S.

In addition, similarly to the connection line 1520, the reinforced pattern PT may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

As illustrated in FIG. 16A, when the stretchable display device of the related art is extended, a higher extension stress is concentrated on the curved area CA. (An area represented with light gray in FIGS. 16A and 16B refers to an area where a stress is concentrated and an area represented with dark gray refers to an area where a stress is less concentrated). Therefore, the plurality of connection lines disposed in the curved area CA is very highly likely to be cracked.

Accordingly, in the stretchable display device according to still another embodiment of the present disclosure, the connection line 1520S including the reinforced pattern PT is disposed in the curved area CA so that the probability of cracks in the plurality of connection lines 1520 may be lowered.

Specifically, as illustrated in FIG. 16B, the reinforced pattern PT in the curved area CA is less affected by the extension stress so that the curved area CA may more effectively withstand the stress. Accordingly, the extension rate of the stretchable display device according to still another embodiment of the present disclosure may be improved.

Further, in the stretchable display device according to still another embodiment of the present disclosure, the diameter of the reinforced pattern PT is larger than the line width of the connection line 1520 so that the resistance of the connection line 1520 is reduced, which may also reduce a signal transfer delay of the connection line 1520.

The embodiments of the present disclosure can also be described as follows:

According to an aspect of the present disclosure, a stretchable display device includes a lower substrate, a plurality of first substrates disposed on the lower substrate, the plurality of first substrate including at least one pixel and each of the plurality of first substrates being spaced apart from each other, a plurality of connection substrates connecting adjacent first substrates among the plurality of first substrates, and a plurality of connection lines electrically connecting pads disposed on the plurality of adjacent first substrates, the plurality of connection lines being disposed on side surfaces of the plurality of connection substrates. Therefore, a resistance of the connection line may be reduced or minimized.

Each of the plurality of connection lines may be disposed on both side surfaces of each of the plurality of connection substrates to be connected in parallel.

The plurality of connection substrates and the plurality of connection lines may have a wavy shape and include a straight area in which the plurality of connection substrates and the plurality of connection lines extend in a straight line and a curved area in which the plurality of connection substrates and the plurality of connection lines are curved.

In the straight area and the curved area, the plurality of connection lines may be disposed only on the both side surfaces of the plurality of connection substrates.

A thickness of each of the plurality of connection lines may be 0.6 µm to 1 µm.

In the curved area, the plurality of connection lines may be disposed only on the both side surfaces of the plurality of connection substrates and in the straight area, the plurality of connection lines is disposed only on a top surface of the plurality of connection substrates.

A thickness of each of the connection lines disposed in the curved area may be smaller than a thickness of each of the connection lines disposed in the straight area.

In the straight area and the curved area, the plurality of connection lines may be disposed on a top surface and the side surfaces of the plurality of connection substrates.

Each of the plurality of connection lines may include an upper connection line disposed on the top surface of the plurality of connection substrates and a lower connection line disposed on the side surfaces of the plurality of connection substrates and a thickness of the lower connection line may be smaller than a thickness of the upper connection line.

In the curved area, the plurality of connection lines may be disposed on the side surfaces of the plurality of connection substrates and in the straight area, the plurality of connection lines is disposed on a top surface and the side surfaces of the plurality of connection substrates.

According to another aspect of the present disclosure, a stretchable display device comprises a plurality of first substrates disposed on a lower substrate, the plurality of first substrates being spaced apart from each other and each of the first substrates including at least one pixel, a plurality of connection substrates connecting a plurality of adjacent first substrates among the plurality of first substrates, the plurality of connection substrates including a plurality of first connection substrates and a plurality of second connection substrates, a plurality of connection lines electrically connecting pads disposed on the plurality of adjacent first substrates, a first area including the plurality of first connection substrates and the plurality of connection lines and a second area adjacent to the first area including the plurality of second connection substrates and the plurality of connection lines, wherein the plurality of first connection substrates and the plurality of connection lines included in the first area extends linearly or substantially linearly within the first area, and wherein the plurality of second connection substrates and the plurality of connection lines included in the second area extends non-linearly within the second area.

A straight area in which the plurality of connection substrates and the plurality of connection lines extend in a straight line and a curved area in which the plurality of connection substrates and the plurality of connection lines are bent are defined.

A thickness of a plurality of first connection substrates disposed in the first area may be greater than a thickness of a plurality of second connection substrates disposed in the second area.

A thickness of the plurality of connection lines disposed in the first area may be equal to a thickness of the plurality of connection lines disposed in the second area.

The plurality of connection lines disposed in the curved area may include a reinforced pattern disposed in the second area.

The reinforced pattern may have a circular shape and a diameter of the reinforced pattern is larger than a width of the plurality of connection lines disposed in the first area.

The second area includes at least one of the reinforced pattern of the connection line.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
a lower substrate;
a plurality of first substrates disposed on the lower substrate, the plurality of first substrates including at least one pixel and each of the plurality of first substrates being spaced apart from each other;
a plurality of connection substrates connecting adjacent first substrates among the plurality of first substrates, each of the plurality of connection substrates having a first side surface, a second side surface facing the first side surface, and a top surface between the first and second side surfaces; and
a plurality of electrically conductive connection lines electrically connected to pads disposed on the plurality of adjacent first substrates, the plurality of connection lines being disposed on the side surfaces of the respective ones of the plurality of connection substrates,
wherein each of the plurality of connection substrates has a bottom surface opposite the top surface,
wherein the bottom surface of a connection substrate of the plurality of connection substrates directly contacts the lower substrate,
wherein a material composition of each of the plurality of connection substrates is different from a material composition of each of the plurality of electrically conductive connection lines, and
wherein the plurality of connection substrates and the plurality of connection lines have a wavy shape and include a straight area in which the plurality of connection substrates and the plurality of connection lines extend in a straight line or a substantially straight line and a curved area in which the plurality of connection substrates and the plurality of connection lines are curved.

2. The stretchable display device according to claim 1, wherein each of the plurality of connection lines disposed on at least two side surfaces of a respective connection substrate of the plurality of connection substrates is adjacent to and spaced apart from each other by the connection substrate.

3. The stretchable display device according to claim 1, wherein in the curved area, the plurality of connection lines are disposed on the side surfaces of the plurality of connection substrates and in the straight area, the plurality of connection lines are disposed on a top surface and the side surfaces of the plurality of connection substrates.

4. A stretchable display device, comprising:
a lower substrate;
a plurality of first substrates disposed on the lower substrate, the plurality of first substrates including at least one pixel and each of the plurality of first substrates being spaced apart from each other;

a plurality of connection substrates between adjacent first substrates among the plurality of first substrates, each of the plurality of connection substrates having a first side surface, a second side surface facing the first side surface, and a top surface between the first and second side surfaces; and a plurality of conductive connection lines electrically connected to pads, at least one conductive connection line of the plurality of conductive connection lines being disposed on the first and second side surfaces of the respective ones of the plurality of connection substrates, wherein each of the plurality of connection substrates is distinct and separate structures from each of the plurality of conductive connection lines, and wherein a connection substrate of the plurality of connection substrates between two adjacent first substrates among the plurality of first substrates have a wavy shape that includes a curved area and a straight area from a plan view.

5. The stretchable display device of claim 4, comprising:
an upper substrate opposite the lower substrate,
wherein the upper substrate directly contacts the plurality of conductive connection lines.

6. The stretchable display device of claim 4, comprising:
an upper substrate opposite the lower substrate,
wherein the upper substrate directly contacts the plurality of connection substrates.

7. The stretchable display device of claim 4, comprising:
an upper substrate opposite the lower substrate,
wherein the upper substrate directly contacts the plurality of conductive connection lines in both the straight area and the curved area.

8. The stretchable display device of claim 4, comprising:
an upper substrate opposite the lower substrate,
wherein the upper substrate directly contacts the plurality of connection substrates in the curved area.

9. The stretchable display device of claim 4, wherein each of the plurality of connection substrates and each of the plurality of electrically conductive connection lines are distinct and separate structures such that each of the plurality of connection substrates and each of the plurality of electrically conductive connection lines are not integrally formed with each other.

10. The stretchable display device of claim 4, wherein the straight area and the curved area are continuously and contiguously connected to each other from a plan view.

11. The stretchable display device of claim 4, wherein the straight area and the curved area do not overlap with the lower substrate from a plan view.

12. The stretchable display device of claim 1, wherein a material composition of each of the plurality of connection substrates is different from a material composition of and each of the plurality of electrically conductive connection lines.

* * * * *